ALUMINUM DIFFUSIONS

Filed June 25, 1970

INVENTOR.
Douglas L. Elgan
Robert G. Hays
BY
*Mueller & Aichele*
ATTORNEYS

United States Patent Office 3,681,155
Patented Aug. 1, 1972

3,681,155

ALUMINUM DIFFUSIONS

Douglas L. Elgan, Tempe, and Robert G. Hays, Scottsdale, Ariz., assignors to Motorola, Inc., Franklin Park, Ill.

Filed June 25, 1970, Ser. No. 49,601
Int. Cl. H01l 7/02
U.S. Cl. 148—188 8 Claims

ABSTRACT OF THE DISCLOSURE

A method of diffusing aluminum is disclosed. A layer of aluminum oxide on a semiconductor body is heated in a hydrogen atmosphere whereby aluminum from the aluminum oxide diffuses into the semiconductor body. This invention includes the simultaneous diffusing of aluminum from the aluminum oxide layer and a second dopant through an opening in the aluminum oxide layer whereby the two dopants diffuse into the semiconductor body.

BACKGROUND OF THE INVENTION

Figure 1:
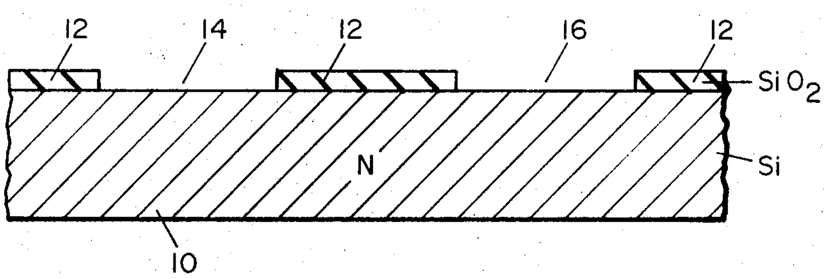

This invention relates to diffusions and more particularly to the diffusion of aluminum into a semiconductor body.

Aluminum diffusions are not widely used at the present time due to the difficulty of diffusing aluminum into semiconductors. The most widely used method of diffusing aluminum into a semiconductor involves evaporating aluminum metal in a vacuum furnace. This method involves controlling the partial pressure of the aluminum vapor to regulate the amount of aluminum available for diffusion purposes. The need to regulate the partial pressure of the aluminum vapor results in a system which is very difficult to accurately control.

Other methods of diffusing into the semiconductor bodies are also unsatisfactory in that they lack control. For example, using aluminum metal positioned on a semiconductor body is unsatisfactory since it forms an alloy at elevated temperatures necessary for diffusion instead of a simple straightforward diffusion.

The aluminum diffusion method involving the use of a layer of aluminum oxide in an oxidizing atmosphere or in an inert gas atmosphere is unsatisfactory because it results in either no diffusion or an irregular and uncontrollable diffusion at best.

SUMMARY OF THE INVENTION

It is an object of this invention to provide an improved method for diffusing aluminum into semiconductor bodies.

It is another object of this invention to provide a method of diffusing aluminum into a semiconductor body in which the amount of aluminum diffused can be closely controlled.

It is yet another object of this invention to provide a method in which aluminum and a second dopant can be diffused simultaneously into a semiconductor body.

These and other objects are accomplished in accordance with this invention by a method in which a layer of aluminum oxide is positioned on a semiconductor body and heated to an elevated temperature, for example, above 900° C., in a hydrogen containing atmosphere whereby the aluminum from the aluminum oxide diffuses into the semiconductor body. Another example of this method involves passing a second dopant through an opening in the aluminum oxide layer whereby at elevated temperatures the second dopant diffuses through the opening in the aluminum oxide layer into the semiconductor at the same time the aluminum from the aluminum oxide layer diffuses into the semiconductor body. In regions where the aluminum oxide remains on the semiconductor, the aluminum oxide will mask and prevent diffusions of the second dopant.

Other objects and advantages of this invention will be apparent from the following detailed description, reference being made to the accompanying drawing wherein the steps of the subject process are shown.

In the drawing:

FIG. 1 through 5 show the steps of the process of this invention.

DETAILED DESCRIPTION OF THE ILLUSTRATIVE EMBODIMENTS

Aluminum will diffuse from a layer of aluminum oxide into a semiconductor substrate, for example, silicon, when heated to a temperature above about 900° C. in a hydrogen containing atmosphere. The hydrogen atmosphere enables the aluminum in the aluminum oxide to be available for diffusion into the semiconductor body. In its simplest structure, a layer of aluminum oxide is deposited on a layer of silicon. The surface of the silicon should be free of silicon oxide for best diffusion results. Upon heating the layer of aluminum oxide and the substrate to a temperature above 900° C. in a hydrogen containing atmosphere, preferably a substantially pure hydrogen atmosphere, the aluminum will diffuse from the aluminum oxide layer into the silicon wafer or substrate.

This invention is further illustrated in FIGS. 1 through 5. An N type silicon wafer 10 is heated in an oxidizing atmosphere at a temperature of 900° C. to 1250° C. for a period of time sufficient to form a silicon dioxide layer 12 of the desired thickness. This layer may have a thickness of 100 to about 5,000 angstroms. While the silicon substrate is shown to be of an N type, the substrate may also be of a P type. The silicon dioxide layer 12 may also be formed by decomposing a silicon containing material such as silane, $SiH_4$, in an oxidizing atmosphere at an elevated temperature. Silicon dioxide layer 12 is patterned with standard photolithographic techniques and etched with hydrofluoric acid to form openings 14 and 16 as shown in FIG. 1.

Figure 2:
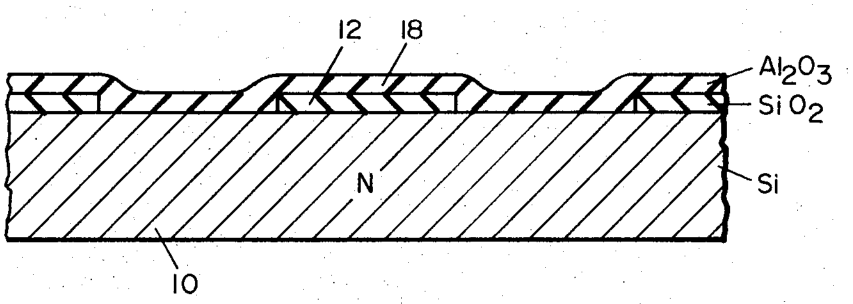

As shown in FIG. 2, a layer 18 of aluminum oxide is deposited on the silicon dioxide layer 12 and on top of the silicon substrate 10 in the openings 14 and 16. The aluminum oxide layer 18 may be pyrolytically deposited. An example of pyrolytic deposition is to heat the silicon substrate to a temperature of about 900° C. in a hydrogen ambient and to which is added a gaseous stream of hydrogen containing an aluminum halide, such as aluminum chloride or aluminum bromide, and carbon dioxide. As a mixture of these two gas streams passes over the heated substrate, aluminum oxide is deposited thereon.

Figure 3:
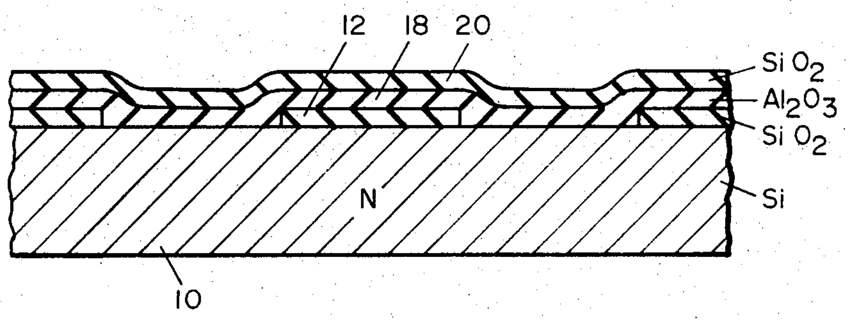
Figure 4:
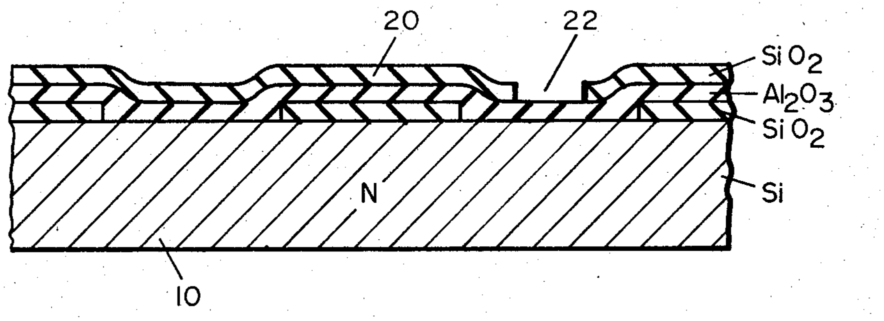
Figure 5:
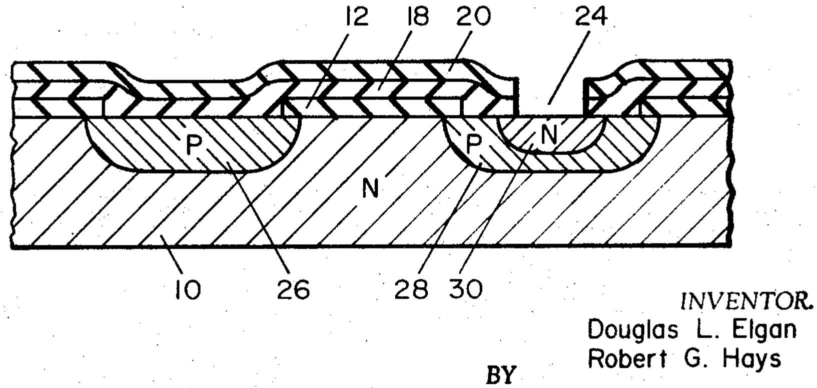

As shown in FIG. 3, a layer 20 of silicon dioxide is then pyrolytically deposited on top of the aluminum oxide layer 18. The silicon dioxide layer 20 is formed by decomposing a silicon containing material such as silane, $SiH_4$, in an oxidizing atmosphere at an elevated temperature. The thickness of the layer 20 is preferably about 3,000 to 5,000 angstroms. The silicon dioxide 20 is patterned with standard photolithographic techniques and etched with hydrofluoric acid to form an opening 22 as shown in FIG. 4. An etchant such as boiling phosphoric acid is placed in the opening 22 to etch the aluminum oxide layer 18 and provide the opening 24 as shown in FIG. 5.

An N type dopant, for example phosphorus, is then diffused through the opening 24 while the substrate is held at an elevated temperature, above 900° C. in the hydrogen containing atmosphere. The N type dopant is diffused through the opening 24 to form the N type diffused region 30. At the same time as the N type dopant diffuses through the opening 24, the aluminum oxide layer 18 which is in contact with the semiconductor substrate diffuses aluminum to form the diffused P type regions 26 and 28. In order for the P type diffused region 28 to completely surround and go underneath the N type diffused region 30, it is necessary that the area 24 have a width which is compatible with the depth of the diffused region 28. When area 24 has a width greater than several times the depth of the diffused region, the P type region will not pass underneath N type region 30, but will have two separate P type regions which are on either side of N type region 30.

Example 1

An N type silicon wafer having a resistivity of 3 to 5 ohm-cm. was placed in a furnace and heated to a temperature of 1150° C. in an oxygen atmosphere for twenty minutes to produce a layer of silicon dioxide having a thickness of about 1000 angstroms. The silicon dioxide layer was etched in accordance with standard processing techniques to form a mask of the type shown in FIG. 1. A primary hydrogen stream was passed through the R.F. heated furnace at a rate of 52 liters per minute to provide a hydrogen ambient. The wafer was heated to 1150° C. and 885 cc. per minute of anhydrous hydrogen chloride was added to the hydrogen stream in a period of one minute to clean and etch the surface of the silicon that was not covered by the mask. The temperature was then reduced to 900° C. and a stream of 280 cc. per minute of hydrogen was passed over an aluminum chloride source. The temperature of the aluminum chloride source was 135° C. The aluminum chloride bearing hydrogen stream and a stream of carbon dioxide having a rate of 1.1 liters per minute was added to the primary hydrogen stream for a period of twenty minutes. A layer of aluminum oxide, about 1500 angstroms thick was deposited. The wafer was then heated in a furnace at 1120° C. for sixty minutes in a 5 liter per minute hydrogen ambient while the aluminum diffused from the aluminum oxide layer into the exposed silicon surface. The diffused wafer was evaluated and found to have a sheet resistance of 280 ohms per square a diffusion depth of 12.4 microns and a surface concentration of about $8\times10^{16}$ atoms of aluminum per cc. There was no diffusion of aluminum under the silicon dioxide mask.

Example 2

An N type silicon wafer having a resistivity of 3 to 5 ohm-cm. was placed in a furnace and heated to a temperature of 1150° C. in an oxygen atmosphere for twenty minutes to produce a layer of silicon dioxide having a thickness of about 1000 angstroms. The silicon dioxide layer was etched in accordance with standard processing techniques to form a mask of the type shown in FIG. 1. A primary hydrogen stream was passed through the R.F. heated furnace at a rate of 52 liters per minute to provide a hydrogen ambient. The wafer was heated to 1150° C. and 885 cc. per minute of anhydrous hydrogen chloride was added to the hydrogen stream in a period of one minute to clean and etch the surface of the silicon that was not covered by the mask. The temperature was then reduced to 900° C. and a stream of 250 cc. per minute of hydrogen was passed over an aluminum bromide source. The temperature of the aluminum bromide source was 135° C. The aluminum bromide bearing stream and a stream of carbon dioxide having a rate of 1.1 liters per minute were added to the 58 liter per minute primary hydrogen stream for a period of twenty five minutes. A layer of aluminum oxide about 1700 angstroms thick was deposited. The system was then purged with hydrogen for about five minutes. A stream of hydrogen having a flow rate of 79 cc. per minute was bubbled through silicon tetrachloride and a stream of oxygen having a flow rate of 802 cc. per minute were added to the hydrogen primary stream for a period of about 3.5 minutes. A layer of silicon dioxide about 3800 angstroms thick was deposited on top of the aluminum oxide layer to form a structure as shown in FIG. 3. By using conventional etching techniques, an opening was made to pass directly through both the silicon dioxide layer and the aluminum oxide layer to form an opening as shown in FIG. 5. The wafer was then heated in a furnace at 1150° C. for forty five minutes while a hydrogen stream having a flow rate of 24.4 liters per minute and containing 24.6 cc. per minute of nitrogen containing 10 percent phosphine was passed over the wafer. Aluminum was diffused into the silicon wafer in those areas in which the aluminum oxide was directly in contact with the silicon surface. Phosphorus was diffused into the silicon wafer through the opening in the silicon dioxide layer and the aluminum oxide layer. The aluminum diffusion was found to be 8.9 microns deep and had a sheet resistivity of about 800 ohms per square. The phosphorus diffusion was 2.1 microns in depth and had a sheet resistivity of 27 ohms per square.

Aluminum type diffusions of the type set forth above are particularly well suited for use in silicon power devices which are adapted for use in the deflection circuits in color television sets. Aluminum diffusions are also well suited for high voltage junction field effect transistors.

What is claimed is:

1. A method of diffusing aluminum into a semiconductor comprising the steps of forming a layer of aluminum oxide having a thickness of about 1500 angstroms to 1700 angstroms on said semiconductor, and heating said aluminum oxide layer in a hydrogen atmosphere to diffuse said aluminum from said aluminum oxide layer into said semiconductor.

2. A method of diffusing aluminum into a semiconductor comprising the steps of:

forming a layer of silicon dioxide on a semiconductor, providing an opening in said silicon dioxide layer, forming a layer of aluminum oxide on said semiconductor in said silicon dioxide layer opening, and heating said aluminum oxide layer in a hydrogen atmosphere whereby aluminum from said aluminum oxide layer diffuses into said semiconductor.

3. A method as described in claim 2 whereby said aluminum oxide layer is heated to a temperature above 900° C.

4. A method of simultaneously diffusing aluminum and a second dopant into a semiconductor comprising the steps of:

depositing a layer of silicon dioxide on said semiconductor, forming a first opening in said silicon dioxide layer, depositing a layer of aluminum oxide on said silicon dioxide layer and on said semiconductor in said first opening, forming a second opening in said aluminum oxide layer within said first opening which is smaller than said first opening, and diffusing a dopant through said second opening into said semiconductor while maintaining said semiconductor in a hydrogen atmosphere at an elevated temperature whereby aluminum from said aluminum oxide layer diffuses into the semiconductor.

5. In the manufacture of semiconductor devices, the method of using aluminum as a conductivity type determining impurity, comprising the steps of:

providing a semiconductor substrate;

forming a layer of aluminum oxide on those portions of said substrate in which the aluminum is to be diffused;

forming a layer of silicon dioxide on said aluminum oxide layer; and heating said aluminum oxide layer to about a temperature above 900° C. in a hydrogen atmosphere whereby aluminum from said aluminum oxide layer diffuses into said substrate.

6. In the manufacture of semiconductor devices, the method of using aluminum as a conductivity type determining impurity, comprising the steps of:

providing a semiconductor substrate;

forming a first layer of silicon dioxide on said substrate;

patterning said first layer of silicon dioxide to expose portions of said substrate;

forming a layer of aluminum oxide on said exposed portions of said substrate and on said remaining first layer of silicon dioxide;

forming a second layer of silicon dioxide on said aluminum oxide layer;

heating said aluminum oxide layer in a hydrogen atmosphere whereby aluminum from said aluminum oxide layer diffuses into said substrate.

7. A method as described in claim 6 whereby said aluminum oxide layer is heated to a temperature above 900° C.

8. In the manufacture of semiconductor devices, the method of using aluminum as the conductivity type determining impurity, comprising the steps of:

providing a semiconductor substrate;

depositing a first layer of silicon dioxide on said substrate;

forming a first opening in said silicon dioxide layer for exposing portions of said substrate;

depositing a layer of aluminum oxide on said first silicon dioxide layer and on said exposed portion of said substrate;

forming a second layer of silicon dioxide on said aluminum oxide layer;

forming a second opening in said second silicon dioxide layer and the corresponding underlying aluminum oxide layer for exposing a portion of said substrate within said first opening which is smaller than said first opening; and diffusing a dopant through said second opening into said semiconductor while maintaining said semiconductor in a hydrogen atmosphere at an elevated temperature whereby aluminum from said aluminum oxide layer diffuses into the semiconductor simultaneously with the diffusion of said dopant into said exposed portion of said substrate.

References Cited

UNITED STATES PATENTS

| | | | |
|---|---|---|---|
| 3,413,145 | 11/1968 | Robinson et al. ______ | 117—201 |
| 3,143,444 | 8/1964 | Lowe et al. _________ | 148—188 |
| 3,215,570 | 11/1965 | Andrews et al. ____ | 148—188 X |
| 3,573,116 | 3/1971 | Cohen ___________ | 148—188 X |

TOBIAS E. LEVOW, Primary Examiner

J. COOPER, Assistant Examiner

U.S. Cl. X.R.

117—201, 215; 252—62.3 E